US008522096B2

(12) United States Patent
Wang et al.

(10) Patent No.: US 8,522,096 B2
(45) Date of Patent: Aug. 27, 2013

(54) METHOD AND APPARATUS FOR TESTING 3D INTEGRATED CIRCUITS

(75) Inventors: Laung-Terng Wang, Sunnyvale, CA (US); Nur A. Touba, Austin, TX (US); Michael S. Hsiao, Blacksburg, VA (US); Zhigang Jiang, Burlingame, CA (US); Shianling Wu, Princeton Junction, NJ (US)

(73) Assignee: Syntest Technologies, Inc., Sunnyvale, CA (US)

( * ) Notice: Subject to any disclaimer, the term of this patent is extended or adjusted under 35 U.S.C. 154(b) by 180 days.

(21) Appl. No.: 13/222,130

(22) Filed: Aug. 31, 2011

(65) Prior Publication Data

US 2012/0110402 A1 May 3, 2012

Related U.S. Application Data

(60) Provisional application No. 61/409,243, filed on Nov. 2, 2010.

(51) Int. Cl.
*G01R 31/28* (2006.01)

(52) U.S. Cl.
USPC .............................. 714/731; 714/30; 714/729

(58) Field of Classification Search
USPC ........................................... 714/30, 729, 731
See application file for complete search history.

(56) References Cited

U.S. PATENT DOCUMENTS

| | | | | |
|---|---|---|---|---|
| 6,961,885 B2* | 11/2005 | Man et al. | ...................... | 714/727 |
| 7,689,884 B2* | 3/2010 | Seuring | .......................... | 714/729 |
| 7,739,568 B1* | 6/2010 | Bertanzetti | ................... | 714/729 |
| 7,930,607 B2* | 4/2011 | Sinanoglu | ...................... | 714/729 |
| 7,979,764 B2* | 7/2011 | Foutz et al. | ................... | 714/729 |
| 8,024,631 B1* | 9/2011 | Bertanzetti | .................... | 714/729 |
| 8,046,653 B2* | 10/2011 | Rajski et al. | .................. | 714/738 |

OTHER PUBLICATIONS

C. Barnhart, V. Brunkhorst, F. Distler, O. Farnsworth, A. Ferko, B. Keller, D. Scott, B. Koenemann, and T. Onodera, "Extending OPMISR Beyond 10x Scan Test Efficiency," *IEEE Design & Test of Computers*, vol. 19, No. 5, pp. 65-73, Sep.-Oct. 2002.

J. Rajski, J. Tyszer, M. Kassab, and N. Mukherjee, "Embedded Deterministic Test," *IEEE Trans. On Computer-Aided Design*, vol. 23, No. 5, pp. 776-792, May 2004.

L.T. Wang, X. Wen, H. Furukawa, F.-S. Hsu, S.-H. Lin, S.-W. Tsai, K.S. Abdel-Hafez, and S. Wu, VirtualScan: A New Compressed Scan Technology for Test Cost Reduction, in *Proc. IEEE International Test Conference*, pp. 916-925, Oct. 2004.

N. Sitchinava, S. Samaranayake, R. Kapur, E. Gizdarski, F. Neuveux, and T.W. Williams, "Changing the Scan Enable During Shift," in *Proc. IEEE VLSI Test Symposium*, pp. 73-78, Apr. 2004.

(Continued)

*Primary Examiner* — Esaw Abraham
(74) *Attorney, Agent, or Firm* — Bacon & Thomas, PLLC (57) ABSTRACT

A method and apparatus for testing a scan-based 3D integrated circuit (3DIC) using time-division demultiplexing/multiplexing allowing for high-data-rate scan patterns applied at input/output pads converting into low-data-rate scan patterns applied to each embeddded module in the 3DIC. A set of 3D design guidelines is proposed to reduce the number of test times and the number of through-silicon vias (TSVs) required for both pre-bond testing and post-bond testing. The technique allows reuse of scan patterns developed for pre-bond testing of each die (layer) for post-bond testing of the whole 3DIC. It further reduces test application time without concerns for I/O pad count limit and risks for fault coverage loss.

36 Claims, 9 Drawing Sheets

(56) References Cited

OTHER PUBLICATIONS

L Whetsel, "Core Test Connectivity, Communication, and Control," in *Proc. IEEE International Test Conference*, pp. 303-312, Oct. 1998.

A. Khoche, "Test Resource Partitioning for Scan Architectures Using Bandwidth Matching," in *Proc. IEEE Test Resource Partitioning Workshop*, Paper 1.4, Oct. 2002.

A. Sehgal, V. Iyengar, and K. Chakrabarty, "SOC Test Planning Using Virtual Test Access Architectures," *IEEE Trans. on VLSI Systems*, vol. 12, No. 12, pp. 1263-1276, Dec. 2004.

E.J. Marinissen and Y. Zorian, "Testing 3D Chips Containing Through-Silicon Vias," in *Proc. IEEE International Test Conference*, Paper ET1.1, Nov. 2009.

\* cited by examiner

| Design Style | Recommended Solution |
|---|---|
| PI/PO pins on upper layers | Reconfigured into wrapper scan cells |
| Functional TSV inputs | Reconfigured into wrapper scan cells or force to 0s/1s |
| Functional TSV outputs | Reconfigured into wrapper scan cells |
| Scan cells across layers | Stitch scan cells in the same layer only |
| Test clocks across layers | Generated within each layer |
| Scan ports on upper layers | Use test TSVs to connect to I/O pads |

FIG. 5

| | Archit. 1 | Archit. 2 | Archit. 3 | Archit. 4 |
|---|---|---|---|---|
| Bus Structure | Dedicated bus | Dedicated bus | Shared bus | Shared bus |
| # Pad Channels | 1 | 1 | 10 | 10 |
| # Module Channels | 1 | 10 | 10 | 20 |
| Routing Channels | 1X | 1X | 10X | 10X |
| TDDM Circuit | 1-bit register | 10-bit serializer | 10-bit register | 20-bit register |
| Pad Frequency | 20 MHz | 200 MHz | 200 MHz | 400 MHz |
| Shift Frequency | 10 MHz | 10 MHz | 10 MHz | 10 MHz |
| Test Time Reduction | 1X | 10X | 10X | 20X |

METHOD AND APPARATUS FOR TESTING 3D INTEGRATED CIRCUITS

FIELD OF THE INVENTION

The present invention generally relates to the field of scan-based design and test using design-for-test (DFT) techniques. Specifically, the present invention relates to the field of scan testing and test compression.

BACKGROUND

Three-dimensional (3D) packaging is short for 3D die stacking using through-silicon vias (TSVs), conceptually similar to nails, as opposed to wire-bonds for connecting the dies to the package substrate. A 3D integrated circuit (3DIC) may contain two or more dies (layers), each of which could include a partial or full system-on-chip (SOC) logic that may contain tens to hundreds of millions of gates.

In a typical 3D chip, I/O pads are not available to all dies (layers). Instead, they are only bonded to the bottom layer, and functional signal values must be elevated from the bottom layer to upper layers via TSVs (also referred to as functional TSVs).

Due to increased SOC complexity and gate count, test data volume and test application time (that affect test cost) have increased dramatically even for single stuck-at faults. With the widespread use of deep submicron (DSM) processes, the need for low power test patterns to detect path-delay faults, transition faults, and bridging faults is becoming greater to maintain the quality and avoid yield loss of next-generation SOC manufacturing. Such requirement further drives up test cost.

Figure 1:
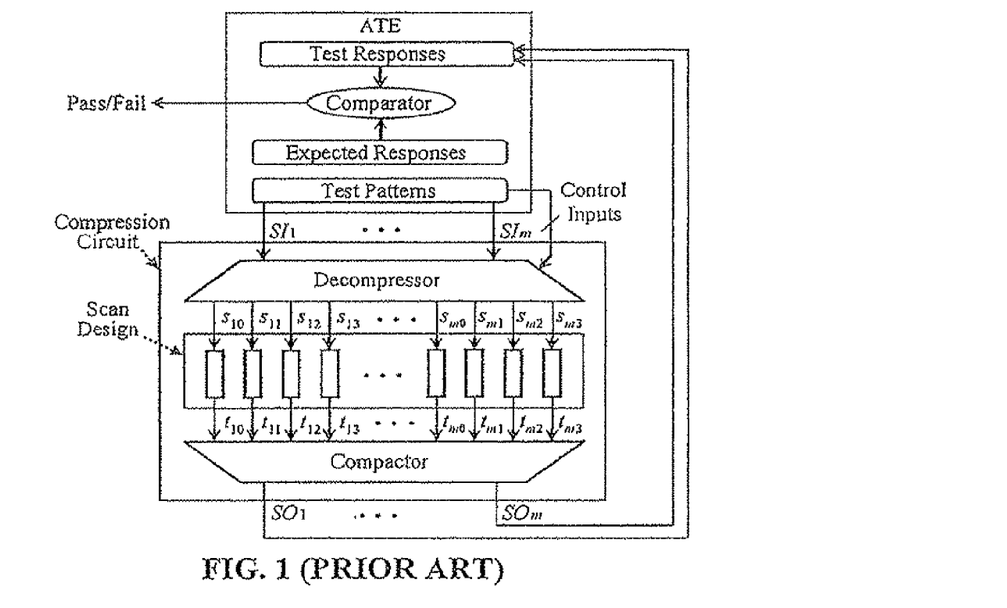
FIG. 1 is a circuit diagram of a prior art system using a conventional scan compression architecture.

One prior art widely practiced in the industry today to reduce test cost while ensuring that the total number of external scan chains (often referred to as scan channels) stays within the I/O pad count limit of the chip package during manufacturing test is scan compression [1-4]. The conventional scan compression architecture is shown in FIG. 1. It has been shown that scan compression can provide 10 to 100 times (10× to 100×) reduction in test data volume and test application time and hence can drastically reduce manufacturing test cost. The approach usually assumes a 1-to-n scan configuration, in which the number of internal scan chains is n times that of external scan inputs/outputs (referred to as scan I/O pads). A decompressor is added before internal scan chains for stimulus decompression and a compactor is added after internal scan chains for response compaction (see FIG. 1).

Figure 2:
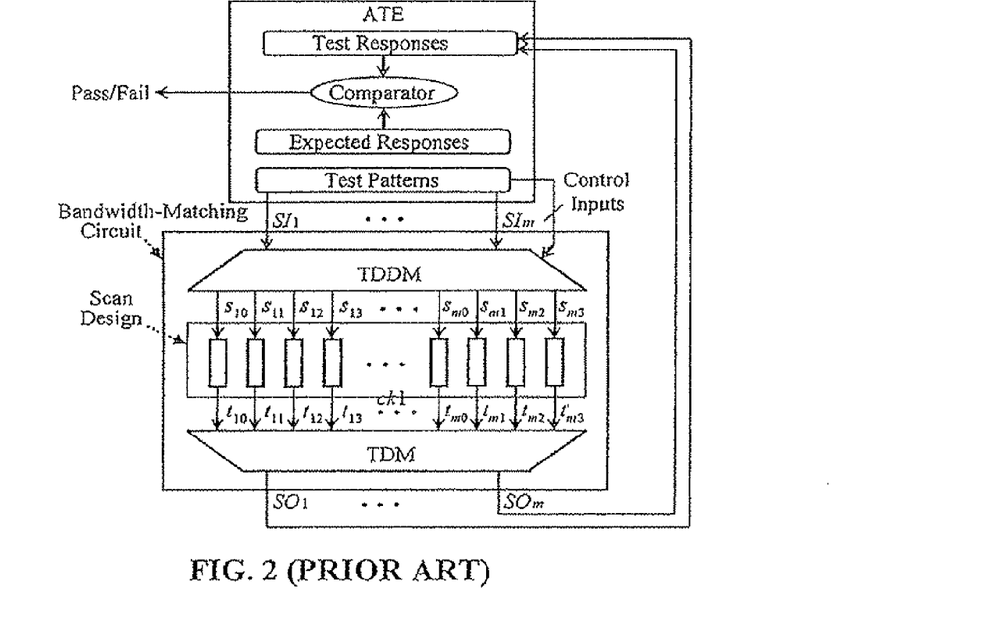
FIG. 2 is a circuit diagram of a prior art system using a general bandwidth-matching architecture.

A second prior art is to employ a bandwidth matching or time-division demultiplexing/multiplexing (TDDM/TDM) technique proposed in [5-7] to further reduce test cost for SOC testing. The general bandwidth-matching architecture is shown in FIG. 2. Because typical I/O pads of a chip are designed to operate at very high frequencies, the idea is to take advantage of the high-speed I/O's of a chip, ranging from a few hundred MHz to a few GHz. By contrast, internal scan chains usually only operate at a much lower frequency, ranging from 10 MHz to 100 MHz. By shifting in and out scan data at a high data rate on the scan inputs through a TDDM/TDM or bandwidth-matching circuit, test application time can be further reduced by additional 10× to 100× depending on the high-speed scan I/O pads' frequency, while test data volume remains the same.

Figure 3:
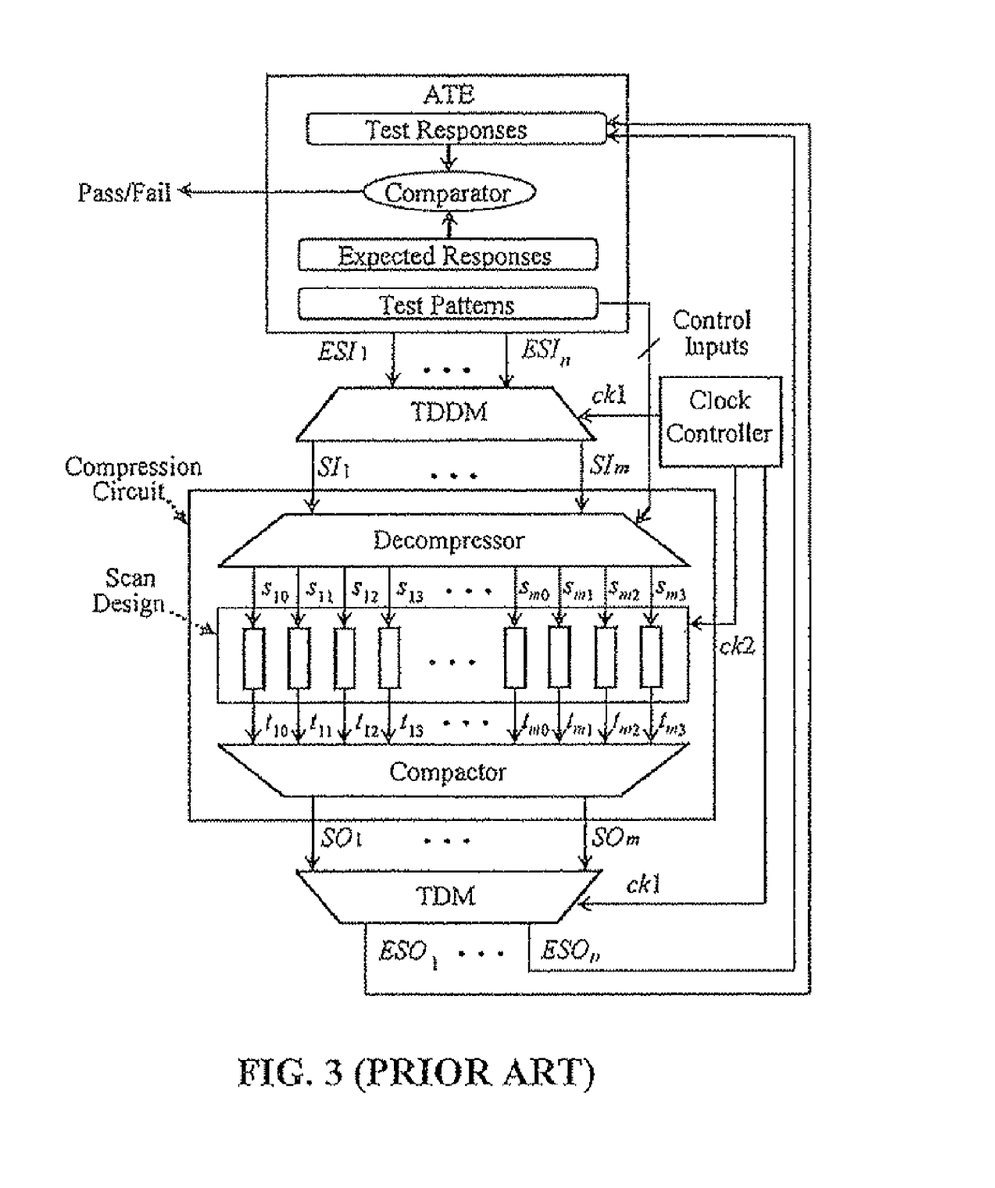
FIG. 3 is a circuit diagram of a prior art system using a general UltraScan architecture.

A third prior art is to use the UltraScan architecture proposed in [U.S. Pat. No. 7,512,851] that embeds a scan compression circuit in a bandwidth-matching circuit. The general UltraScan architecture is shown in FIG. 3. As the UltraScan architecture combines both scan compression and bandwidth-matching circuits, it can reduce test application time by as much as 1000× and test data volume by as much as 100×, simultaneously.

While these combined prior art solutions are effective in reducing test data volume and test application time, they are mainly used for SOC applications on a single die. Since one single 3D chip can contain two or more dies, 3DIC designers are now facing an unprecedented challenge of managing both test cost and I/O pad count limit during pre-bond and post-bond testing. Test cost is dictated by test application time and test data volume, whereas I/O pads are limited not only by the available number of pads presents on the bottom die but also by the need to route those bottom pads via TSVs to provide access to signals on other (upper) dies. Because I/O pins on upper dies cannot be accessed directly without going through the I/O pads on the bottom layer, to cope with the I/O pad count limit, one common approach is to add a multiplexer network before and after the scan chains on each die or to combine a few shorter scan chains into a single long chain so one can test with the limited pads from the bottom die to test all dies via TSVs in series. This approach increases test cost drastically. Yet another common approach is to use a smaller number of scan channels built-in on each die. This approach when combined with scan compression, unfortunately, may cause fault coverage loss as aliasing may occur more often in the SOC design.

As I/O pads in a 3DIC are usually not available to all dies (layers), which is a severe constraint, it has been reported in [8] that it would require 2n test sessions to completely test a 3DIC during pre-bond testing and post-bond testing, when the 3DIC contains n dies. During pre-bond testing, n test sessions are required to test all bare dies one at a time. During post-bond testing, n−1 test sessions are required to test stacked dies 1 and 2 first, 1, 2, and 3 next, etc., where die 1 is the bottom die that connects to the I/O pads. A final test is for the whole packaged chip. This may pose a serious problem as a 2n test cost is economically infeasible. How to fully utilize scan technology in a 3DIC yet still to reduce test cost and improve fault coverage is now becoming a very important challenge.

Therefore, there is a need to further reduce test cost as well as reduce the number of test sessions for both pre-bond and post-bond testing. There is also a need to ensure that the total number of external scan chains stays within the I/O pad count limit of the chip packaging during pre-bond and post-bond testing. In addition, due to the severe constraint on I/O pads which are only available on the bottom layer, there is further a need for a 3DIC design methodology to comply with a set of 3D scan design rules so as to fully utilize scan technology in the 3DIC to reap the benefit of reduced test cost and high fault coverage.

SUMMARY OF INVENTION

Figure 4:
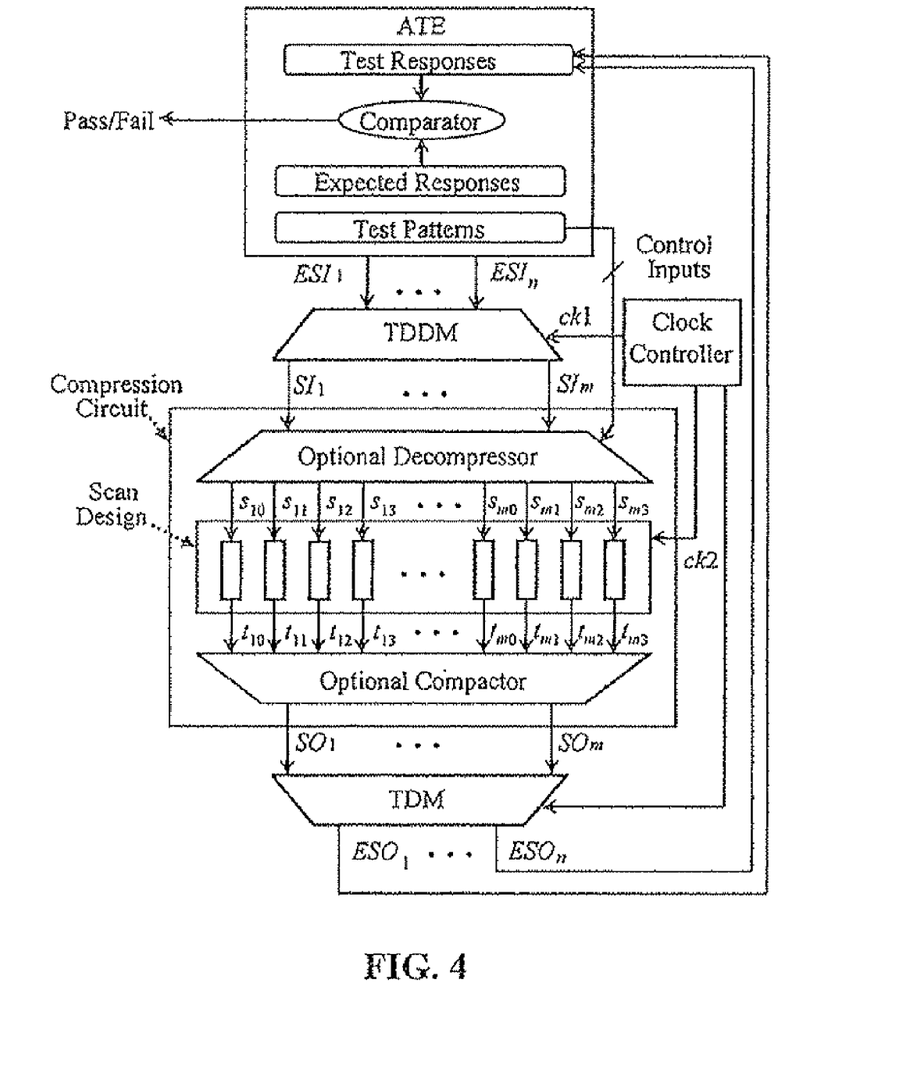
FIG. 4 shows a circuit diagram of a 3DIC test architecture in accordance with the present invention using a TDDM/TDM technique for 3DIC testing.

The present invention as shown in FIG. 4 is to apply the bandwidth-matching or time-division demultiplexing/multiplexing (TDDM/TDM) technique to 3DIC testing. An aspect of the present invention is to reduce test cost while adhering to the strict pad count limit allocated to a 3D chip during both pre-bond and post-bond testing. One or more pairs of a TDDM circuit and a TDM circuit are inserted between the die's external scan input/output ports (referred to as I/O pads when present on the bottom layer or I/O pins when present on upper layers) and the scan chain inputs/outputs in a scan-based integrated circuit (often referred to as a scan design).

The TDDM/TDM technique takes advantage of the high-speed I/O's of a circuit, since typical I/O pads are designed to operate at very high frequencies R1, ranging from a few hundred MHz to a few GHz, while scan chains usually only operate at a much lower frequency R2, ranging from 10 MHz to 100 MHz. The ability to apply scan data externally at a high data rate and demultiplexing the data to each die in an alternate manner that cycles through two or more dies means test cycles and I/O pad count can be further kept the same or reduced as if the entire chip contains only one die during post-bond testing.

A high-speed clock ck1 is used to sample the TDDM circuit and the TDM circuit for transporting a high-speed test stimulus to selected scan chains in a module of a die and for converting the captured test response to a high-speed test response, respectively. The high-speed clock ck1 may be selectively supplied externally from an automatic test equipment (ATE), generated internally using a first phase-locked loop (PLL), or generated internally from a slow-speed clock ck2. The frequency of the high-speed clock ck1 shall match the high-speed data rate R1. One unique feature is to reconfigure one or more I/O pads on the bottom layer and one or more I/O pins (via TSVs) on upper layers as high-speed I/O pads and high-speed I/O pins, respectively, by operating them all at the high-speed data rate R1.

Also, the slow-speed clock ck2 is used to shift-in/shift-out the transported slow-speed test stimulus and the captured test response into and out of the selected scan chains in the module of the die, respectively. The slow-speed clock ck2 may be selectively supplied externally from the ATE, generated internally using a second phase-locked loop (PLL), or generated internally from the high-speed clock ck1. The frequency of the slow-speed clock ck2 shall match the slow-speed data rate R2.

The TDDM circuit (a.k.a. a serial-in parallel-out circuit or a serial-to-parallel converter) may be a combinational logic network (often called a high-speed demultiplexer), a shift register (often called a deserializer), or a register comprising one or more storage elements driven by the high-speed clock CK1; wherein said storage element is selectively a flip-flop, a latch, or a scan latch. The TDM circuit (a.k.a. a parallel-in serial-out circuit or a parallel-to-serial converter) may be a combinational logic network (often called a high-speed multiplexer), a shift register (often called a serializer), or a register comprising one or more storage elements driven by said high-speed clock CK1; wherein said storage element is selectively a flip-flop, a latch, or a scan latch.

The present invention further includes a set of design guidelines such that one may reduce the number of TSVs across layers and test the whole packaged chip only once during post-bond testing. These design guidelines include, but are not limited to: (1) For primary input/output (PI/PO) pins on upper layers as well as functional TSV inputs and outputs, add an isolation ring (referred to as a die-level wrapper) by reconfiguring them into wrapper cells similar to one proposed in the IEEE 1500 Std. or the IEEE P1687 Std. Alternatively, TSV inputs may be simply forced to constant 0s or 1s during pre-bond testing; (2) For scan cells that are candidates to be stitched across layers, each layer must have its own scan chains, and has at least a dedicated single point of entry from the bottom layer via a TSV (referred to as a test TSV). This means, all scan cells within the same layer should be stitched together wherever possible and cannot cross layers; (3) For test clocks on each layer, generate, derive, or duplicate such clocks within the same layer; and (4) For scan ports on upper layers, transport test data from the I/O pads on the bottom layer through test TSVs to the I/O pins on upper layers.

These design guidelines when adhere to can reduce the number of TSVs across layers and the same tests on stacked dies can be used during pre-bond and post-bond testing. If a die-level wrapper is employed, this may allow users to reuse test patterns which were developed for pre-bond testing of each die for post-bond testing of the die in the stacked dies. It can also further reduce test application time, stay within the I/O pad count limit, and incur no fault coverage loss.

In the present invention, test data for pre-bond testing may be further applied on high-speed I/O pads at a frequency faster than or equal to that for post-bond testing to further reduce overall 3D test cost. One may further redirect the bandwidth left from a die (or module) when finishing testing a die (or a module) to another die (or module) during pre-bond or post-bond testing, when the die contains two ore more modules.

While the present invention mainly targets testing of 3DICs, it is also applicable to testing of a multi-chip module (MCM) or package-on-package (POP). Scan compression and other forms of test methods such as logic built-in self-test (BIST), coupled with the present invention, are also applicable to implement in any die or any module.

The foregoing and additional objects, features and advantages of the invention will become more apparent from the following detailed description, which proceeds with references to the following drawings.

DETAILED DESCRIPTION OF THE INVENTION

The following description is presently contemplated as the best mode of carrying out the present invention. This description is not to be taken in a limiting sense but is made merely for the purpose of describing the principles of the invention. The scope of the invention should be determined by referring to the appended claims.

FIG. 1 shows a circuit diagram of a prior art system using a conventional scan compression architecture. The conventional scan compression architecture consists of three major parts: (1) a scan design with a 1-to-n scan configuration, (2) a decompressor located between scan inputs and internal scan chain inputs, and (3) a compactor located between internal scan chain outputs and scan outputs. Its combination is a compression circuit.

The figure shows the general architecture for a split ratio of 4. The scan design has a 1-to-4 scan configuration. That is, one original scan chain is split into 4 shorter scan chains in a balanced way. The decompressor, is inserted between the scan inputs ($SI_1, \ldots, SI_m$) and the internal scan chain inputs ($s_{10}, s_{11}, s_{12}, s_{13}, \ldots, s_{m0}, s_{m1}, s_{m2}, s_{m3}$). The compactor is inserted between the internal scan chain outputs ($t_{10}, t_{11}, t_{12}, t_{13}, \ldots, t_{m0}, t_{m1}, t_{m2}, t_{m3}$) and the scan outputs ($SO_1, \ldots, SO_m$). Additional control inputs may be used for reducing the constraints imposed on the decompressor and fault coverage loss on the compactor.

Test patterns (or compressed stimuli) are then shifted in from the automatic test equipment (ATE) to the compression circuit through the scan inputs and control inputs, and test responses (or compressed responses) are shifted out from the compression circuit to the ATE (tester) for comparison with the expected responses through the scan outputs in the ATE comparator, which generates a Pass/Fail signal. Since the longest scan chain length is reduced by 4×, theoretically test data volume and test application time can also be reduced by 4×. Due to possibly stronger constraints induced by the decompressor and the compactor, however, the actual compression ratio may be lower than 4.

FIG. 2 shows a general bandwidth-matching architecture for a split ratio of 4. The scan design has a 1-to-4 scan configuration. That is, one original scan chain is split into 4 shorter scan chains in a balanced way. A time-division demultiplexing (TDDM) circuit is inserted between the scan inputs ($SI_1, \ldots, SI_m$) and the internal scan chain inputs ($s_{10}, s_{11}, s_{12}, s_{13}, \ldots, s_{m0}, s_{m1}, s_{m2}, s_{m3}$). A time-division multiplexing (TDM) circuit is inserted between the internal scan chain outputs ($t_{10}, t_{11}, t_{12}, t_{13}, \ldots, t_{m0}, t_{m1}, t_{m2}, t_{m3}$) and the scan outputs ($SO_1, \ldots, SO_m$). Both TDDM and TDM circuits operate at a higher frequency than the internal scan chains under the control of a clock controller which may be embedded in the bandwidth-matching circuit or external to the bandwidth-matching circuit.

The TDDM circuit (a.k.a. a serial-in parallel-out circuit or a serial-to-parallel converter) includes m 1-to-4 high-speed demultiplexers or deserializers. The TDM circuit (a.k.a. a parallel-in serial-out circuit or a parallel-to-serial converter) includes m 4-to-1 high-speed multiplexers or serializers. Consider a design with 16 scan chains running at a shift clock frequency of 10 MHz. Each scan chain may be split into 10 sub-scan chains with the scan-in (SI) and scan-out (SO) ports of each 10 sub-scan chains connected to a high-speed demultiplexer/deserializer and a high-speed multiplexer/serializer, respectively. In this case, the 16 pairs of the TDDM and TDM circuits run at 100 MHz, while all 160 sub-scan chains can now be shifted at 10 MHz. As a result, since test application time is proportional to the number of scan chains, a reduction of 10× in test application time is achieved.

FIG. 3 shows a circuit diagram of a prior art system using a general UltraScan architecture. The UltraScan architecture can further reduce test application time or scan I/O pad count, but not test data volume, when a high-data-rate scan pattern is applied on I/O pads. The architecture consists of three major parts: (1) a compression circuit that includes a decompressor and a compactor, (2) a TDDM circuit placed between the external scan input ports ($ESI_1, \ldots, ESI_n$) and the scan inputs ($SI_1, \ldots, SI_m$), and (3) a TDM circuit placed between the scan outputs ($SO_1, \ldots, SO_m$) and the external scan output ports ($ESO_1, \ldots, ESO_n$).

In the figure, surrounding the compression circuit is a TDDM/TDM pair and a clock controller to create the UltraScan circuit. In this circuit, often a small number of high-speed input pads, typically 1 to 32, are used as external scan input ports, which are connected to the inputs of the TDDM circuit.

The TDDM circuit uses a high-speed clock ck1 to demultiplex the high-speed compressed stimuli at the inputs of the decompressor into slow-speed compressed stimuli operating at a slower data rate ck2 for scan shift. Similarly, the TDM circuit will use the same high-speed clock ck1 to capture and shift out the test responses at the outputs of the compactor to high-speed output pads for comparison. The clock controller may be embedded in the compression circuit or external to the compression circuit.

Assume there are 4 scan inputs/outputs and 16 internal scan chains in a compression circuit and the design can only afford 1 to 10 external scan input/output ports (I/O pads). Suppose the external scan I/O pads can operate at 40 MHz and the scan shift clock frequency of the internal scan chains is 10 MHz. That is, the demultiplexing ratio between the high-speed data rate and the slow-speed data rate is 4. One can now use only one external scan input port to drive the TDDM circuit that includes one high-speed 4-bit deserializer for connecting to the 4 scan chains. This will result in the same test application time and test data volume as in the compression circuit.

Because the design can also afford up to 10 external scan input/output ports, one can then build a TDDM circuit that includes 10 high-speed 4-bit deserializers each coupled to an external scan input port and connects the 40-stage deserializer outputs to 40 scan inputs that get decompressed into 160 smaller scan chains, not just 16 scan chains. This will increase the size of the TDDM/TDM circuit along with the required decompressor and compactor by 10 fold. However, the UltraScan architecture will result in a 10× reduction in test application time, while test data volume will remain the same.

FIG. 4 shows a circuit diagram of a 3DIC test architecture in accordance with the present invention using a TDDM/TDM technique for 3DIC testing. The 3DIC test architecture consists of three major parts: (1) an optional compression circuit that includes a decompressor and a compactor, depending on the need of the scan design, (2) a TDDM circuit placed between the external scan input ports ($ESI_1, \ldots, ESI_n$) and the scan inputs ($SI_1, \ldots, SI_m$), and (3) a TDM circuit placed between the scan outputs ($SO_1, \ldots, SO_m$) and the external scan output ports ($ESO_1, \ldots, ESO_n$). The external scan input/output ports are high-speed I/O pads present on the bottom layer, whereas they are connected to high-speed I/O pins (via TSVs) present on upper layers. The scan design may be one or more modules in a die.

In the figure, surrounding the optional compression circuit is a TDDM/TDM pair and a clock controller to create the 3DIC test circuit. In this circuit, often a small number of high-speed input pads, typically 1 to 32, are used as external scan input ports, which are connected to the inputs of the TDDM circuit.

The TDDM circuit uses a high-speed clock ck1 to demultiplex high-speed stimuli at the inputs of an optional decompressor or the scan design to slow-speed stimuli operating at a slower data rate ck2 for scan shift. Similarly, the TDM circuit will use the same high-speed clock ck1 to capture and shift out the test responses at the outputs of an optional compactor or the scan design to high-speed output pads for comparison. The clock controller may be embedded in an optional compression circuit or external to the optional compression circuit.

Assume there are 4 scan inputs/outputs and 16 internal scan chains in an optional compression circuit and the design can only afford 1 to 10 external scan input/output ports (high-speed I/O pads or I/O pins). Suppose the high-speed I/O pads/pins can operate at 40 MHz and the scan shift clock frequency of the internal scan chains is 10 MHz. That is, the demultiplexing ratio between the high-speed data rate and the slow-speed data rate is 4. One can now use only one external scan input port to drive the TDDM circuit that includes one high-speed 4-bit deserializer for connecting to the 4 scan chains. This will result in the same test application time and test data volume as in the compression circuit.

Because the design can also afford up to 10 external scan input/output ports, one can then build a TDDM circuit that includes 10 high-speed 4-bit deserializers each coupled to an external scan input port and connects the 40-stage deserializer outputs to 40 scan inputs that get decompressed into 160 smaller scan chains, not just 16 scan chains. This will increase the size of the TDDM/TDM circuit along with the required decompressor and compactor by 10 fold. However, the 3DIC test architecture will result in a 10× reduction in test application time, while test data volume will remain the same.

One unique feature of the 3DIC test architecture is that one or more I/O pads on the bottom layer and one or more I/O pins (via TSVs) on upper layers have to be reconfigured as high-speed I/O pads and high-speed I/O pins, respectively, and operate them all at the high-speed data rate R1.

Figure 5:
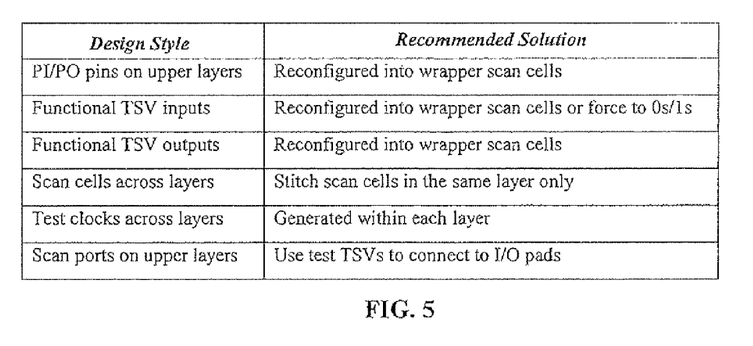
FIG. 5 lists a set of design guidelines for testing a 3DIC, in accordance with the present invention.

FIG. 5 lists a set of design guidelines for testing a 3DIC, in accordance with the present invention so one can reduce the number of TSVs across layers and test the whole packaged chip only once during post-bond testing.

These design guidelines include, but not limited to: (1) For primary input/output (PI/PO) pins on upper layers, functional TSV inputs and functional TSV outputs, add an isolation ring by reconfiguring each one of them into a wrapper cell or forcing it to a constant 0 or 1 during pre-bond testing; (2) For scan cells across layers, make sure each layer must have its own scan chains, and has at least a dedicated single point of entry from the bottom layer via a TSV (referred to as a test TSV). This means, all scan cells within the same layer should be stitched together wherever possible and cannot cross layers; (3) For test clocks across layers, generate, derive, or duplicate such test clocks within the same layer; and (4) For scan ports on upper layers, transport test data from the scan I/O pads on the bottom layer through test TSVs to the upper layers.

These design guidelines when observed may allow reuse of scan patterns which were developed for pre-bond testing of each die for post-bond testing of the whole 3D chip. It may also further reduce test application time, stay within scan (or I/O) pad count limit, and incur no fault coverage loss.

Figure 6:
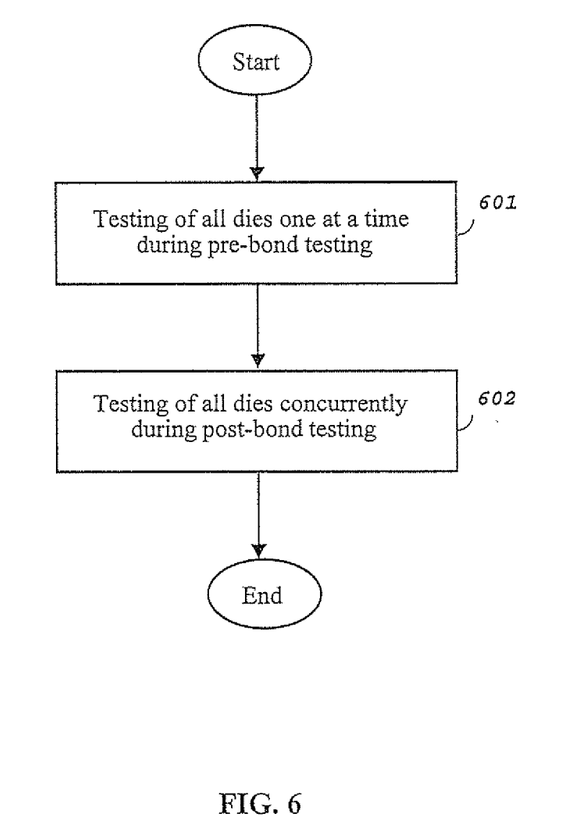
FIG. 6 is a test methodology for testing a 3DIC, in accordance with the present invention.

FIG. 6 shows a test methodology for testing a 3DIC, in accordance with the present invention. The methodology includes making an isolation ring for each I/O pin and generating all test clocks within each layer so one may then test each die individually via TSVs which are directly controllable and observable by I/O pads on the bottom layer. The isolation ring (referred to as a die-level wrapper) may be constructed in accordance with an IEEE 1500 Std. or an IEEE P1687 Std.

During pre-bond testing, test data are first developed to test all dies one at a time 601. During post-bond testing, the same test data may then be transported to the layers for reuse to test all dies concurrently 602. After all dies are successfully verified, one may then simply test the functional TSVs across all layers together by utilizing the isolation rings. This test methodology will then require n+1 test times, not 2n−1 test times, where n is the number of dies in the 3D chip. One may also apply functional patterns as a final test step to test the whole 3D stacked dies simultaneously to increase the final fault coverage. This will require n+2 test times.

To reduce overall 3D test cost, one may apply pre-bond tests faster than or equal to post-bond test frequency because there is more bandwidth. One may also redirect the bandwidth from the die (or module) when its test is completed earlier to another die (or module), when a die includes two or more modules.

Assume a 3DIC contains 2 dies, each having 10 modules. Each module includes only one module scan input and one module scan output, to stay within the pad count limit. While scan compression is often used to reduce test application time and test data volume nowadays, we assume no test compression is done for each module and the shift clock frequency is 10 MHz. We also assume the 3D chip is only allowed to have 10 external scan input ports and 10 external scan output ports so as to reduce the number of TSVs required to test either die.

In the following 4 embodiments, we will illustrate 4 example 3DIC test architectures based on the TDDM/TDM technique and show how the technique can allow test reuse of scan patterns developed for each die during pre-bond testing by reducing the number of TSVs, and further reduce test application time for the whole 3DIC during post-bond testing.

Figure 7:
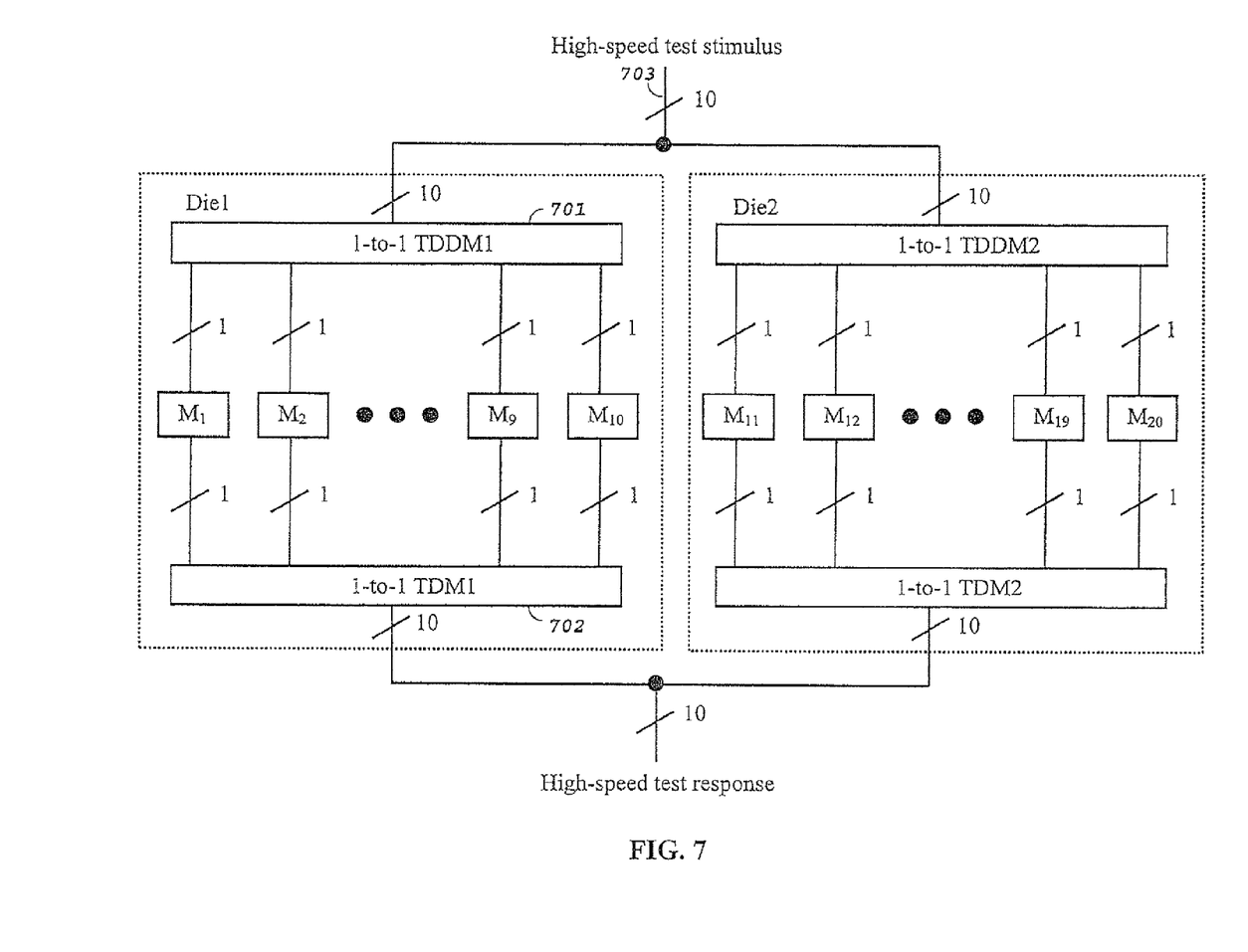
FIG. 7 is a circuit diagram of the first embodiment of the present invention for testing a 3DIC.

FIG. 7 shows a circuit diagram of the first embodiment of the present invention for testing a 3DIC with 2 dies and 10 modules each. The first architecture includes a TDDM circuit 701 and a TDM circuit 702, both running at 20 MHz. In the architecture, a 1-to-1 dedicated bus 703 that transports test data in and out of a module on each die is not shared with other modules. The TDDM circuit couples a 1-bit register (flip-flop) to each module scan input, so a test pattern applied on the external scan input port can be latched in the register within the module. The TDM circuit includes a multiplexer which is coupled to all module scan chain outputs so the captured test response from one die can be shifted out to ATE for analysis one at a time.

Figure 8:
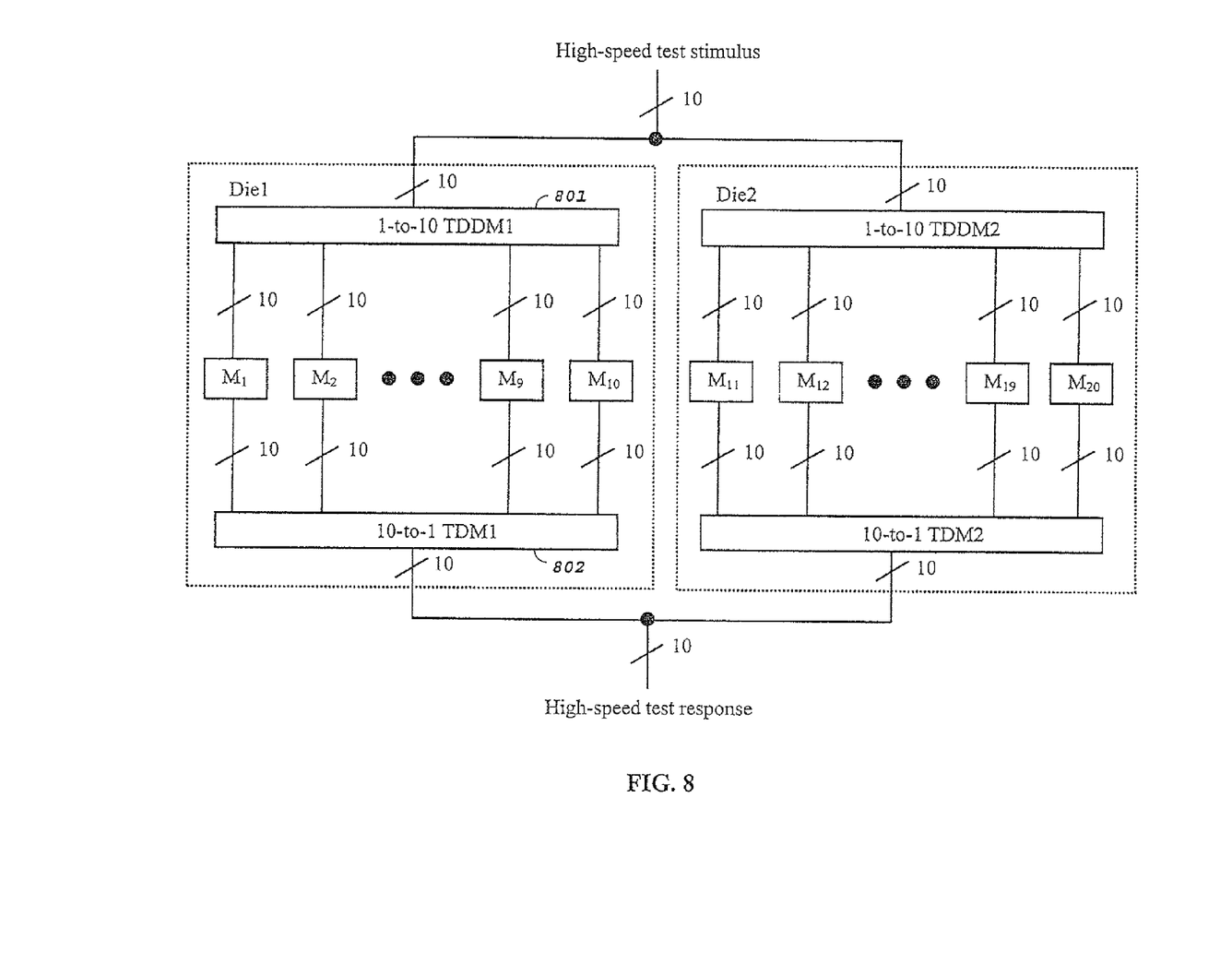
FIG. 8 is a circuit diagram of the second embodiment of the present invention for testing a 3DIC.

FIG. 8 shows a circuit diagram of the second embodiment of the present invention for testing a 3DIC. The second 3DIC test architecture includes a TDDM circuit 801 and a TDM circuit 802, both running at 200 MHz. Unlike Architecture 1, this architecture uses a 1-to-10 (or a 10-to-1) dedicated bus to transport test data in (or out of) a module on each die. This requires that each TDDM/TDM circuit is a high-speed 10-bit deserializer/serializer that operates at 200 MHz. With this architecture, the single scan chain can now be split into 10 balanced short scan channels, resulting in a 10× reduction in test application time.

Figure 9:
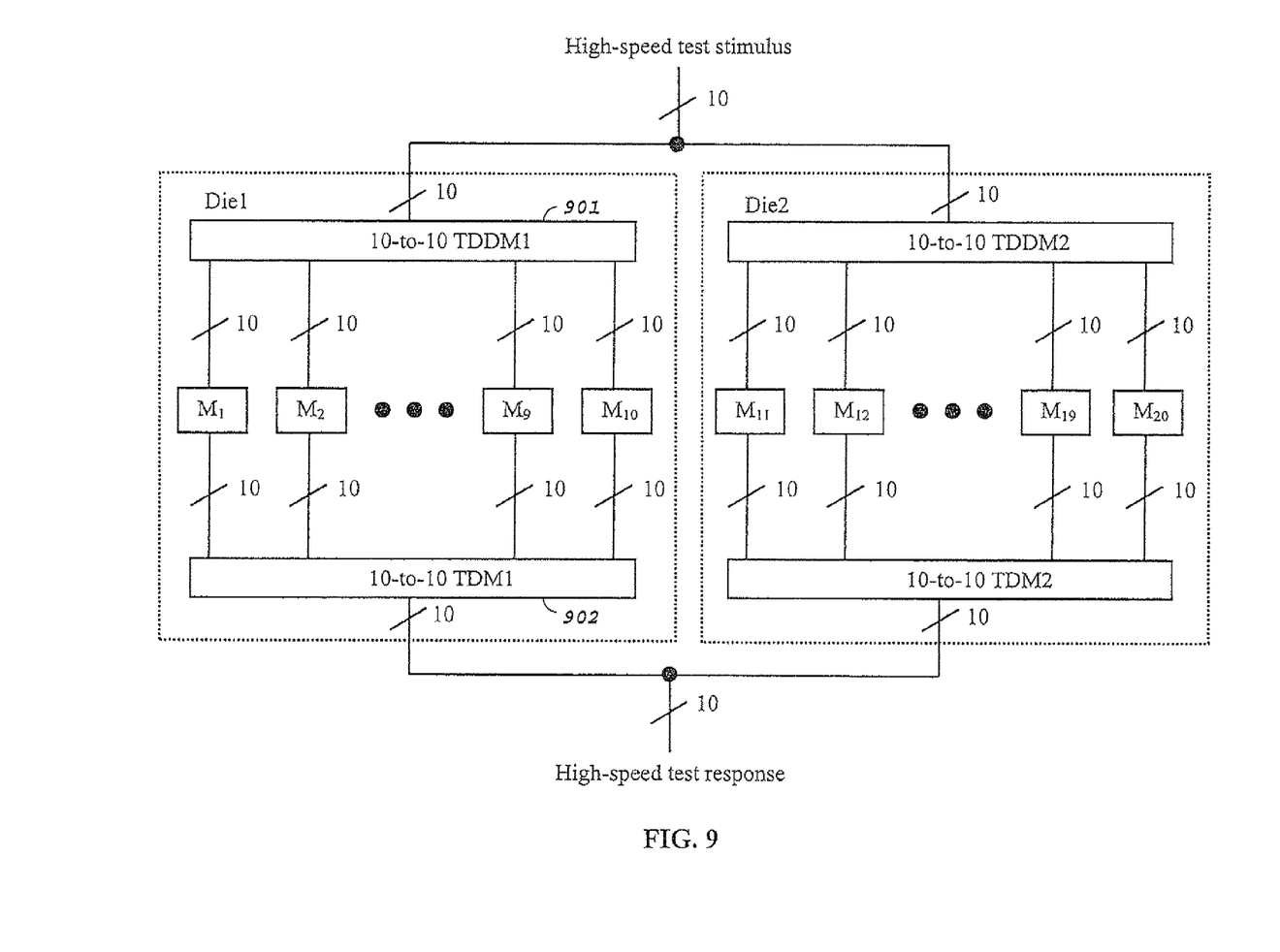
FIG. 9 is a circuit diagram of the third embodiment of the present invention for testing a 3DIC.

FIG. 9 shows a circuit diagram of the third embodiment of the present invention for testing a 3DIC. The third 3DIC test architecture includes a TDDM circuit 901 and a TDM circuit 902, both running at 200 MHz. Unlike Architectures 1 and 2, this architecture uses a 10-to-10 shared bus that transports test data in and out of all modules on each die in parallel. The TDDM circuit now couples a 10-bit register to the shared bus, so a 10-bit test pattern, instead of 1-bit as in Architecture 1, applied on the external scan input port can be latched in the register within the module one at a time. The TDM circuit includes a multiplexer which is coupled to all module scan chain outputs so the captured test response from one die can be shifted out to ATE for analysis one at a time. This will require operating the bus at 200 MHz to shift test data in and out of each module. With this architecture, the single scan chain can now also be split into 10 balanced short scan channels, resulting in a reduction of 10× in test application time.

Figure 10:
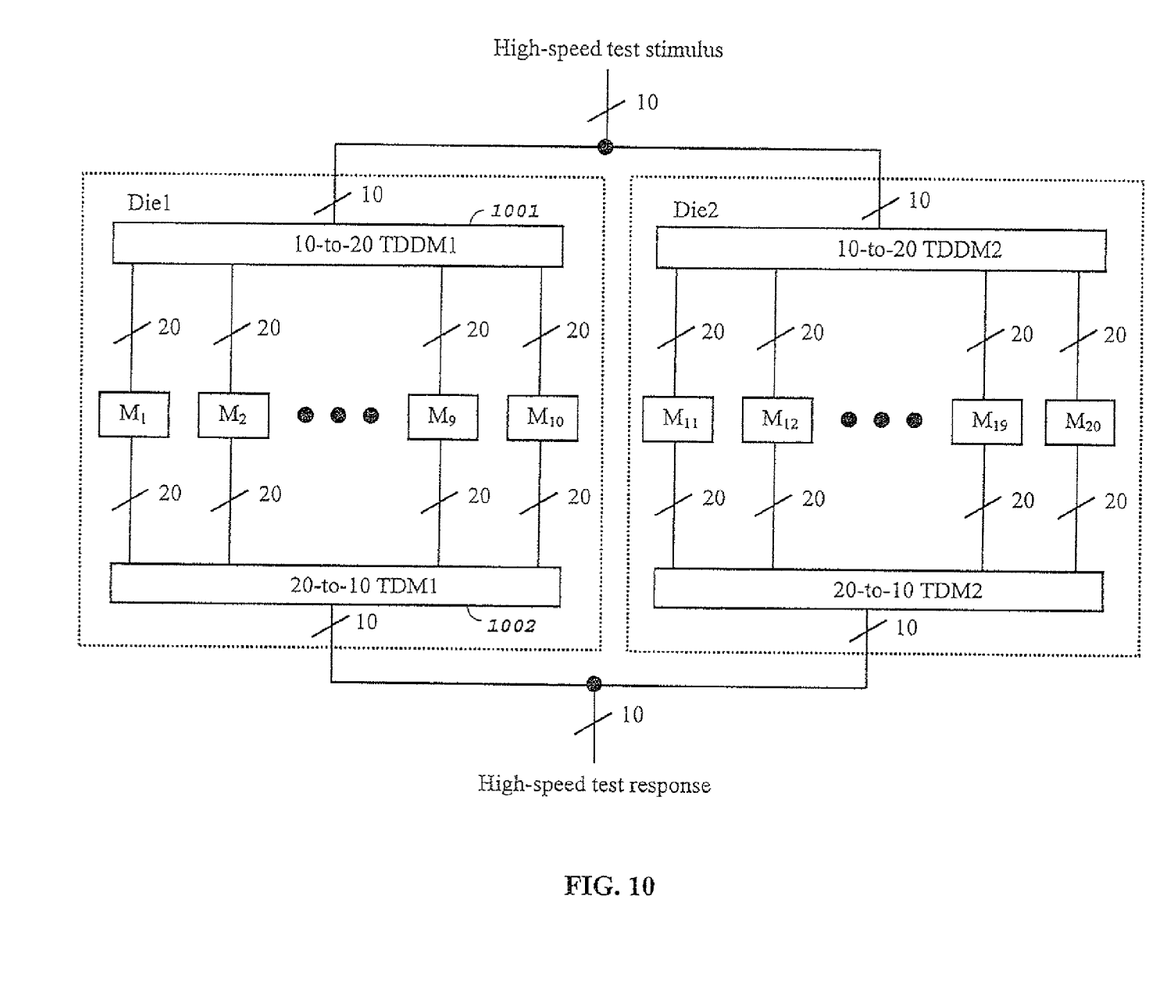
FIG. 10 is a circuit diagram of the fourth embodiment of the present invention for testing a 3DIC.

FIG. 10 shows a circuit diagram of the fourth embodiment of the present invention for testing a 3DIC. The fourth 3DIC test architecture includes a TDDM circuit 1001 and a TDM circuit 1002, both running at 400 MHz. unlike Architecture 3, this architecture uses a 10-to-20 (or a 20-to-10) shared bus to transport test data in (or out of) a module on each die. This requires that the TDDM circuit now couples a 20-bit register to the shared bus, so a 20-bit test pattern, instead of 10-bit as in the Architecture 3 case, applied on the external scan input port in two loads. The TDM circuit includes a multiplexer which is coupled to all module scan chain outputs so the captured test response from one die can be shifted out to ATE for analysis one at a time. This will require operating the bus at 400 MHz to shift test data in and out of each module. With this architecture, the single scan chain can now also be split into 20 balanced short scan channels, resulting in a reduction of 20× in test application time.

Figure 11:
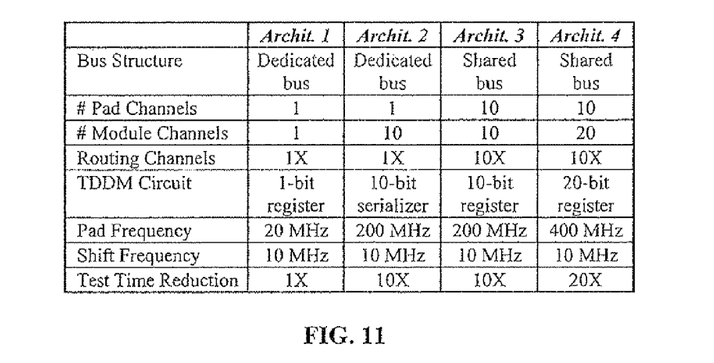
FIG. 11 lists the features and capacities associated with each of the 4 3DIC test architectures given in FIGS. 7-10.

FIG. 11 lists the features and capacities associated with each of the 4 3DIC test architectures given in FIGS. 7-10. One major benefit of using a dedicated bus for each module is the fewer number of wires required to connect the high-speed pad channels to each module (referred to as module channels). Thus, FIG. 7 would be the preferable approach when global routing channels on the bus are taken into consideration. On the other hand, FIGS. 9 and 10 are preferable when the SOC design has already embedded a data bus which can be used for test purpose, especially, when it is required to apply pre-bond tests faster than or equal to post-bond tests. It should be noted that one can still apply scan compression to each module to further reduce test data volume and test application time for each of the architectures we proposed here.

Figure 12:
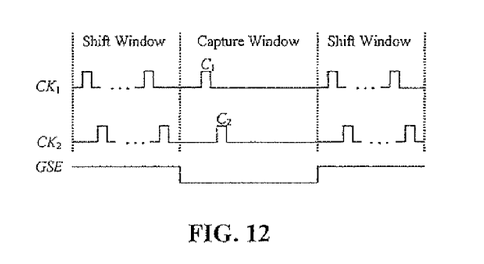
FIG. 12 shows the clock pulses required to perform a shift-in/shift-out and a capture operation during a pre-bond testing or post-bond testing for FIG. 6, in accordance with the invention.

FIG. 12 shows the clock pulses required to perform a shift-in/shift-out and a capture operation during a pre-bond testing or post-bond testing for FIG. 7, in accordance with the invention. During the shift-in/shift-out operation, the external scan input port is operated at 20 MHz which is twice faster than the shift clock frequency of 10 MHz. At one shift cycle ($CK_1$), a scan pattern is loaded into one die, while at the next shift cycle ($CK_2$), another scan pattern is loaded into another die. Both $CK_1$ and $CK_2$ are derived from the 20 MHz high-speed clock. This process continues until both stimulus and response are all fully shifted into and out of both dies, respectively. Then, a capture operation starts by switching the global scan enable signal GSE from 1 to 0. The staggered capture clock pulses, $C_1$ and $C_2$, shown in the figure are an example capture timing that can be used to test stuck-at faults. After completion of the capture operation, GSE switches from 0 to 1, allowing the captured response to shift out for analysis, while shifting in the next stimulus.

Having thus described and illustrated specific embodiments of the present invention, it is to be understood that the objectives of the invention have been fully achieved. And it will be understood by those skilled in the art that many changes in construction and circuitry, and widely differing embodiments and applications of the invention will suggest themselves without departing from the spirit and scope of the present invention. The disclosures and the description herein are intended to be illustrative and are not in any sense limitation of the invention, more preferably defined in scope by the following claims.

What is claimed is:

1. A method for time-division demultiplexing a high-speed test stimulus applied on one or more high-speed I/O pads, provided at a selected data-rate R1, into a slow-speed test stimulus, driven at a selected data-rate R2, for driving selected scan chains in a module of a die in a scan-based three-dimensional (3D) integrated circuit (3DIC) during scan-test mode, the 3DIC containing two or more dies (layers), each die containing one or more modules and comprising selectively one or more said high-speed I/O pads on a bottom layer or one or more high-speed I/O pins on an upper layer provided at said selected data-rate R1, each module including one or more scan chains, each scan chain comprising a plurality of scan cells coupled in series, the scan-based 3DIC further containing one or more time-division demultiplexing (TDDM) circuits, one or more time-division multiplexing (TDM) circuits, at least one high-speed clock CK1, at least one slow-speed clock CK2 connected to said selected scan chains in the module of the die; said method comprising:
(a) generating, shifting-in, demultiplexing said high-speed test stimulus through a said TDDM circuit to said selected scan chains in the module of the die in an alternate manner that cycles through said two or more dies, during a shift-in operation;
(b) capturing a test response to said selected scan chains in the module of the die during a capture operation; and
(c) multiplexing and shifting-out said test response through a said TDM circuit to said high-speed I/O pads for analysis in an alternate manner that cycles through said two or more dies, while shifting-in a new high-speed test stimulus to said selected scan chains, during a shift-out operation.

2. The method of claim 1, wherein said high-speed clock CK1 is selectively supplied externally from an automatic test equipment (ATE), generated internally using a first phase-locked loop (PLL), or generated internally from said slow-speed clock CK2.

3. The method of claim 1, wherein said slow-speed clock CK2 is selectively supplied externally from an automatic test equipment (ATE), generated internally using a second phase-locked loop (PLL), or generated internally from said high-speed clock CK1.

4. The method of claim 1, wherein said high-speed clock CK1 is used to sample test data in said TDDM circuit and said TDM circuit; wherein said selected data-rate R1 matches the frequency of said high-speed clock CK1.

5. The method of claim 4, wherein said TDDM circuit is selectively a combinational logic network, a shift register, or a register comprising one or more storage elements driven by said high-speed clock CK1; wherein said storage element is selectively a flip-flop, a latch, or a scan latch.

6. The method of claim 4, wherein said TDM circuit is selectively a combinational logic network, a shift register, or a register comprising one or more storage elements driven by said high-speed clock CK1; wherein said storage element is selectively a flip-flop, a latch, or a scan latch.

7. The method of claim 1, wherein said low-speed clock CK2 is used to shift a transported slow-speed test stimulus and a captured test response into and out of said selected scan chains in the module of the die, respectively; wherein said selected data-rate R2 matches the frequency of said low-speed clock CK2.

8. The method of claim 1, wherein said 3DIC is selective a 3D packaging, a multi-chip module (MCM), or a package-on-package (POP).

9. The method of claim 1, wherein said module of said die further selectively embeds a conventional scan compression circuit, a logic built-in self-test (BIST) circuit, or a combination of both circuits.

10. The method of claim 1, wherein test stimulus generated for a pre-bond testing using a said TDDM circuit and a said TDM circuit are reused for a post-bond testing.

11. The method of claim 1, wherein said high-speed test stimulus applied on one or more high-speed I/O pads is further applied on said one or more high-speed I/O pads for a pre-bond testing at a frequency faster than or equal to that for a post-bond testing to further reduce overall 3D test cost.

12. The method of claim 1, wherein said high-speed test stimulus applied on one or more high-speed I/O pads is further redirected to test another said module or another said die, when a selected said module or a selected said die has completed its own testing earlier than another said module or another said die, selectively during a pre-bond testing or a post-bond testing.

13. An apparatus for time-division demultiplexing a high-speed test stimulus applied on one or more high-speed I/O pads, provided at a selected data-rate R1, into a slow-speed test stimulus, driven at a selected data-rate R2, for driving selected scan chains in a module of a die in a scan-based three-dimensional (3D) integrated circuit (3DIC) during scan-test mode, the 3DIC containing two or more dies (layers), each die containing one or more modules and comprising selectively one or more said high-speed I/O pads on a bottom layer or one or more high-speed I/O pins on an upper layer provided at said selected data-rate R1, each module including one or more scan chains, each scan chain comprising a plurality of scan cells coupled in series, the scan-based 3DIC further containing one or more time-division demultiplexing (TDDM) circuits, one or more time-division multiplexing (TDM) circuits, at least one high-speed clock CK1, at least one slow-speed clock CK2 connected to said selected scan chains in the module of the die; said apparatus comprising:
    (a) using a first means for generating, shifting-in, demultiplexing said high-speed test stimulus through a said TDDM circuit to said selected scan chains in the module of the die in an alternate manner that cycles through said two or more dies, during a shift-in operation;
    (b) using a second means for capturing a test response to said selected scan chains in the module of the die during a capture operation; and
    (c) using a third means for multiplexing and shifting-out said test response through a said TDM circuit to said high-speed I/O pads for analysis in an alternate manner that cycles through said two or more dies, while shifting-in a new high-speed test stimulus to said selected scan chains, during a shift-out operation.

14. The apparatus of claim 13, wherein said high-speed clock CK1 is selectively supplied externally from an automatic test equipment (ATE), generated internally using a first phase-locked loop (PLL), or generated internally from said slow-speed clock CK2.

15. The apparatus of claim 13, wherein said slow-speed clock CK2 is selectively supplied externally from an automatic test equipment (ATE), generated internally using a second phase-locked loop (PLL), or generated internally from said high-speed clock CK1.

16. The apparatus of claim 13, wherein said high-speed clock CK1 is used to sample test data in said TDDM circuit and said TDM circuit; wherein said selected data-rate R1 matches the frequency of said high-speed clock CK1.

17. The apparatus of claim 16, wherein said TDDM circuit is selectively a combinational logic network, a shift register, or a register comprising one or more storage elements driven by said high-speed clock CK1; wherein said storage element is selectively a flip-flop, a latch, or a scan latch.

18. The apparatus of claim 16, wherein said TDM circuit is selectively a combinational logic network, a shift register, or a register comprising one or more storage elements driven by said high-speed clock CK1; wherein said storage element is selectively a flip-flop, a latch, or a scan latch.

19. The apparatus of claim 13, wherein said low-speed clock CK2 is used to shift a transported slow-speed test stimulus and a captured test response into and out of said selected scan chains in the module of the die, respectively; wherein said selected data-rate R2 matches the frequency of said low-speed clock CK2.

20. The apparatus of claim 13, wherein said 3DIC is selective a 3D packaging, a multi-chip module (MCM), or a package-on-package (POP).

21. The apparatus of claim 13, wherein said module of said die further selectively embeds a conventional scan compression circuit, a logic built-in self-test (BIST) circuit, or a combination of both circuits.

22. The apparatus of claim 13, wherein test data generated for a pre-bond testing using a said TDDM circuit and a said TDM circuit are reused for a post-bond testing.

23. The apparatus of claim 13, wherein said high-speed test stimulus applied on one or more high-speed I/O pads is further applied on said one or more high-speed I/O pads for a pre-bond testing at a frequency faster than or equal to that for a post-bond testing to further reduce overall 3D test cost.

24. The apparatus of claim 13, wherein said high-speed test stimulus applied on one or more high-speed I/O pads is further redirected to test another said module or another said die, when a selected said module or a selected said die has completed its own testing earlier than another said module or another said die, selectively during a pre-bond testing or a post-bond testing.

25. A method for reducing test application time or I/O pad count for a scan-based three-dimensional (3D) integrated circuit (3DIC), the scan-based 3DIC containing two or more dies (layers), each die containing one or more modules and comprising one or more high-speed I/O pads on a bottom layer or one or more high-speed I/O pins on each upper layer, each module including a plurality of scan chains, each scan chain comprising multiple scan cells coupled in series; said method comprising:
    (a) providing a time-division demultiplexing (TDDM) circuit and a time-division multiplexing (TDM) circuit for allowing test data transfer between said high-speed I/O pads and selected scan chains in said scan-based 3DIC during test; and
    (b) using said TDDM circuit and said TDM circuit to operate said high-speed I/O pads or said high-speed I/O pins at a high speed, while operating said selected scan chains at a slow speed;
    wherein said test data transfer to selected scan chains in a module of a die is performed in an alternate manner that cycles through said two or more dies, during a shift operation.

26. The method of claim 25, wherein said 3DIC is selective a 3D packaging, a multi-chip module (MCM), or a package-on-package (POP).

27. The method of claim 25, wherein a said module of a said die further selectively embeds a conventional scan compression circuit, a logic built-in self-test (BIST) circuit, or a combination of both circuits.

28. The method of claim 25, further comprising reusing a test stimulus generated for a pre-bond testing using a said TDDM circuit and a said TDM circuit for a post-bond testing.

29. The method of claim 25, further comprising applying a high-speed test stimulus on said high-speed I/O pads or said high-speed I/O pins for a pre-bond testing at a frequency faster than or equal to that for a post-bond testing.

30. The method of claim 25, further comprising redirecting a high-speed test stimulus applied on said high-speed I/O pads or said high-speed I/O pins to test another said module or another said die, when a selected said module or a selected said die has completed its own testing earlier than another said module or another said die, selectively during a pre-bond testing or a post-bond testing.

31. An apparatus for reducing test application time, test data volume, and I/O pad count for a scan-based three-dimensional (3D) integrated circuit (3DIC), the 3DIC containing two or more dies (layers), each die containing one or more modules and comprising one or more high-speed I/O pads on a bottom layer and one or more high-speed I/O pins on each upper layer, each module including a plurality of scan chains, each scan chain comprising multiple scan cells coupled in series; said apparatus comprising:

(a) using a first means for providing a time-division demultiplexing (TDDM) circuit and a time-division multiplexing (TDM) circuit for allowing test data transfer between said high-speed I/O pads and selected scan chains in said scan-based 3DIC during test; and (b) using a second means for using said TDDM circuit and said TDM circuit to operate said I/O pads at a high speed, while operating said selected scan chains at a slow speed;

wherein said test data transfer to selected scan chains in a module of a die is performed in an alternate manner that cycles through said two or more dies, during a shift operation.

32. The apparatus of claim 31, wherein said 3DIC is selective a 3D packaging, a multi-chip module (MCM), or a package-on-package (POP).

33. The apparatus of claim 31, wherein a said module of a said die further selectively embeds a conventional scan compression circuit, a logic built-in self-test (BIST) circuit, or a combination of both circuits.

34. The apparatus of claim 31, further comprising a means for reusing a test stimulus generated for a pre-bond testing using a said TDDM circuit and a said TDM circuit for a post-bond testing.

35. The apparatus of claim 31, further comprising a means for applying a high-speed test stimulus on said high-speed I/O pads or said high-speed I/O pins for a pre-bond testing at a frequency faster than or equal to that for a post-bond testing.

36. The apparatus of claim 31, further comprising redirecting a high-speed test stimulus applied on said high-speed I/O pads or said high-speed I/O pins to test another said module or another said die, when a selected said module or a selected said die has completed its own testing earlier than another said module or another said die, selectively during a pre-bond testing or a post-bond testing.

* * * * *